(12) United States Patent
Iwata et al.

(10) Patent No.: US 9,420,697 B2
(45) Date of Patent: Aug. 16, 2016

(54) METHOD FOR MANUFACTURING PRINTED WIRING BOARD

(75) Inventors: Yoshiyuki Iwata, Ogaki (JP); Masaru Hori, Nagoya (JP); Hajime Sakamoto, Ogaki (JP)

(73) Assignees: IBIDEN Co., Ltd., Ogaki-shi (JP); National University Corporation Nagoya University, Nagoya-shi (JP)

( * ) Notice: Subject to any disclaimer, the term of this patent is extended or adjusted under 35 U.S.C. 154(b) by 914 days.

(21) Appl. No.: 13/536,056

(22) Filed: Jun. 28, 2012

(65) Prior Publication Data

US 2013/0177714 A1 Jul. 11, 2013

(30) Foreign Application Priority Data

Sep. 9, 2011 (JP) ................................. 2011-197477

(51) Int. Cl.
*H05K 3/02* (2006.01)
*H05K 3/00* (2006.01)
*H05K 3/42* (2006.01)

(52) U.S. Cl.
CPC .............. *H05K 3/027* (2013.01); *H05K 3/0055* (2013.01); *H05K 3/0035* (2013.01); *H05K 3/421* (2013.01); *H05K 2203/095* (2013.01)

(58) Field of Classification Search
CPC ..... H05K 3/027; H05K 3/0055; H05K 3/421; H05K 3/0035
See application file for complete search history.

(56) References Cited

U.S. PATENT DOCUMENTS

| | | | | |
|---|---|---|---|---|
| 4,997,863 | A * | 3/1991 | Ogitani et al. | 523/220 |
| 5,290,383 | A * | 3/1994 | Koshimizu | 156/345.25 |
| 6,083,355 | A * | 7/2000 | Spence | B29C 59/14 204/164 |
| 7,415,761 | B2 * | 8/2008 | Hirose et al. | 29/852 |
| 2001/0051232 | A1 * | 12/2001 | Sakai et al. | 427/569 |
| 2004/0097091 | A1 | 5/2004 | Mouri et al. | |
| 2005/0096238 | A1 * | 5/2005 | Isaki et al. | 510/175 |
| 2005/0143863 | A1 * | 6/2005 | Ruane et al. | 700/276 |

FOREIGN PATENT DOCUMENTS

| | | |
|---|---|---|
| CN | 1614092 A | 5/2005 |
| JP | 5-235520 A | 9/1993 |
| JP | 9-82645 A | 3/1997 |
| JP | 11-140441 A | 5/1999 |
| JP | 2000-068653 A | 3/2000 |
| JP | 2002-252258 A | 9/2002 |
| JP | 2004-186598 | 7/2004 |
| JP | 2004186598 A * | 7/2004 |
| JP | 2005-142198 A | 6/2005 |
| JP | 3661851 B2 | 6/2005 |
| JP | 2006-237603 A | 9/2006 |
| JP | 2009-295658 A | 12/2009 |
| KR | 2003-92096 A | 12/2003 |
| KR | 2005-43601 A | 5/2005 |
| TW | 200616076 A | 5/2006 |
| WO | WO 02/086192 A1 | 10/2002 |

OTHER PUBLICATIONS

Machine Translation of JP 2004186598 A.*
Müller et al. "Further Studies of the continuous UV emission produced by electron impact on CF4". Z. Phys. D-Atoms, Molecules and Clusters vol. 24(1992), pp. 131-139.*
Office Action issued Apr. 28, 2015 in Japanese Patent Application No. 2011-197477.

* cited by examiner

*Primary Examiner* — Dah-Wei D Yuan
*Assistant Examiner* — Jose Hernandez-Diaz
(74) *Attorney, Agent, or Firm* — Oblon, McClelland, Maier & Neustadt, L.L.P

(57) ABSTRACT

A method for manufacturing a printed wiring board includes forming an interlayer insulation layer on a conductive circuit, applying laser to a portion of the interlayer insulation layer such that an opening reaching to the conductive circuit is formed for a via conductor, subjecting the opening to a plasma treatment using a processing gas which includes a reactive gas including a fluorovinyl ether gas having a double bond of two carbon atoms and a fluoroalkyl ether group, forming an upper conductive circuit on the interlayer insulation layer, and forming a via conductor in the opening such that the via conductor connects the conductive circuit and the upper conductive circuit.

20 Claims, 11 Drawing Sheets

FIG. 6

| | Untreated | Permanganic Acid Treatment (no residue) |
|---|---|---|
| SEM Image (×1000) | | |
| Binarized Image | | |
| Remaining Rate | 100% | 0.2% |

FIG. 7
C₃F₆O: trifluoromethyl trifluorovinyl ether
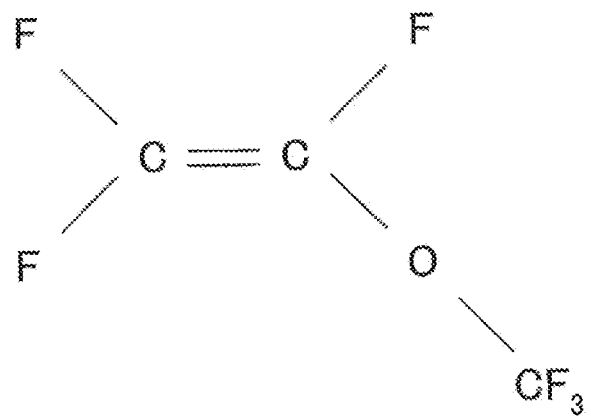
CF₄: tetrafluoromethane
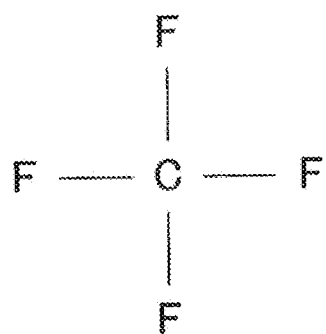

FIG. 8
C₃F₆O: trifluoromethyl trifluorovinyl ether
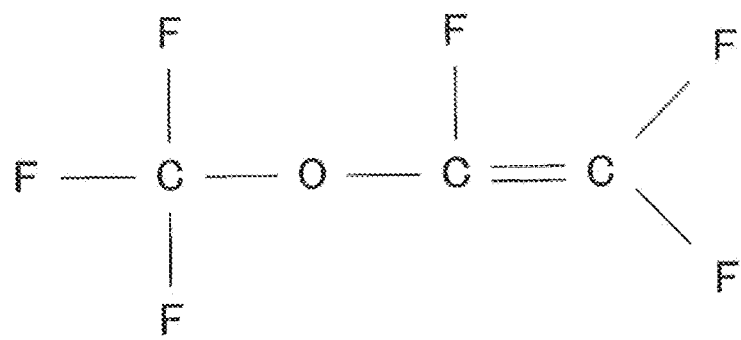
C₅F₁₀O: perfluoropropyl vinyl ether
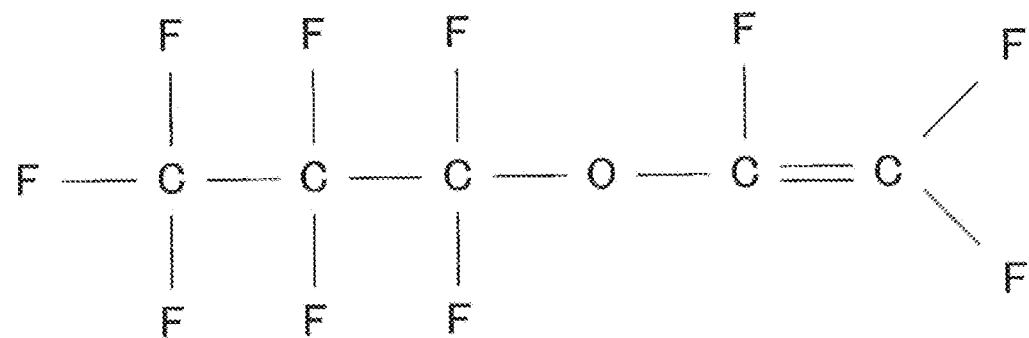

FIG. 9
$C_4F_8O$: pentafluoroethyl trifluorovinyl ether
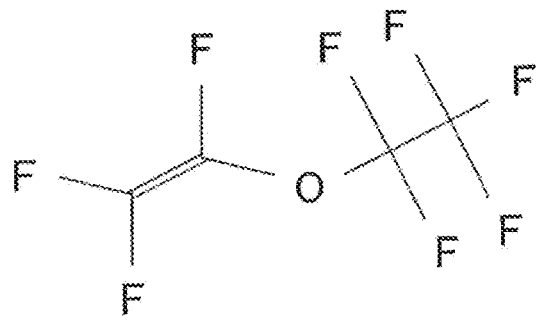
$C_5F_8O$: trifluorovinyl(pentafluoroallyl) ether
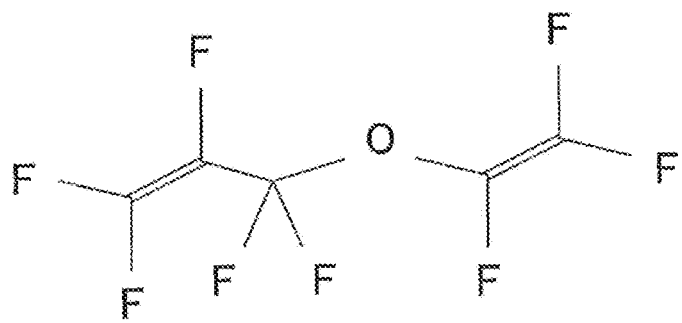
$C_6F_{10}O$: decafluoro-3-oxa-1,6-heptadiene
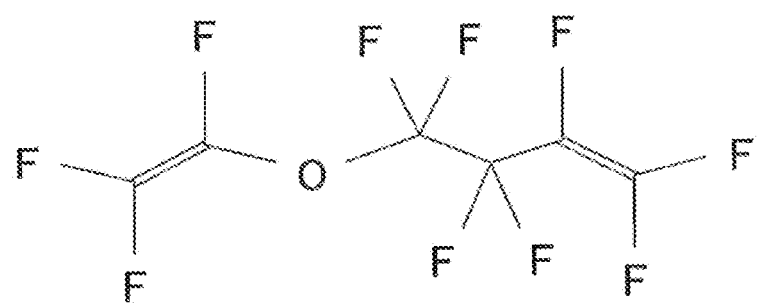

FIG. 11
(A)
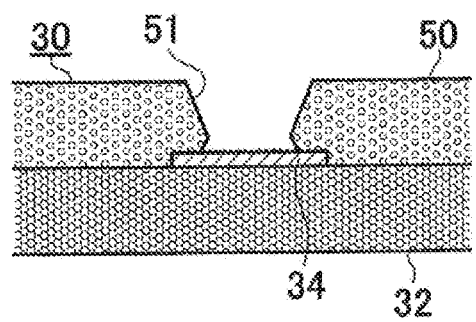
(B)
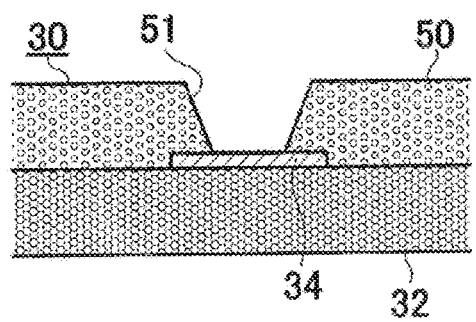

METHOD FOR MANUFACTURING PRINTED WIRING BOARD

CROSS-REFERENCE TO RELATED APPLICATIONS

The present application is based upon and claims the benefit of priority from Japanese Application No. 2011-197477, filed Sep. 9, 2011, the entire contents of which are incorporated herein by reference.

BACKGROUND OF THE INVENTION

1. Field of the Invention

The present invention relates to a method for manufacturing a printed wiring board which includes forming an opening for a via conductor in an interlayer insulation layer by a laser and performing on the opening a plasma treatment using a processing gas containing a fluorovinyl ether gas.

2. Discussion of the Background

Japanese Laid-Open Patent Publication No. 2004-186598 describes performing a plasma treatment on a bottom surface and side wall of a via hole under pressure close to atmospheric pressure. In Japanese Laid-Open Patent Publication No. 2004-186598, a mixed gas containing argon and $CF_4$ is listed as a gas to produce plasma. The entire contents of this publication are incorporated herein by reference.

SUMMARY OF THE INVENTION

According to one aspect of the present invention, a method for manufacturing a printed wiring board includes forming an interlayer insulation layer on a conductive circuit, applying laser to a portion of the interlayer insulation layer such that an opening reaching to the conductive circuit is formed for a via conductor, subjecting the opening to a plasma treatment using a processing gas which includes a reactive gas including a fluorovinyl ether gas having a double bond of two carbon atoms and a fluoroalkyl ether group, forming an upper conductive circuit on the interlayer insulation layer, and forming a via conductor in the opening such that the via conductor connects the conductive circuit and the upper conductive circuit.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 6 shows SEM images and binarization results of desmearing treatments;

FIG. 7 shows chemical structural formulas of $C_3F_6O$ and $CF_4$;

FIG. 8 shows chemical structural formulas of $C_3F_6O$ and $C_5F_{10}O$;

FIG. 9 shows chemical structural formulas of $C_4F_8O$, $C_5F_8O$ and $C_6F_{10}O$;

FIGS. 11(A)-11(B) are views schematically showing via-conductor openings.

DETAILED DESCRIPTION OF THE EMBODIMENTS

Figure 1:
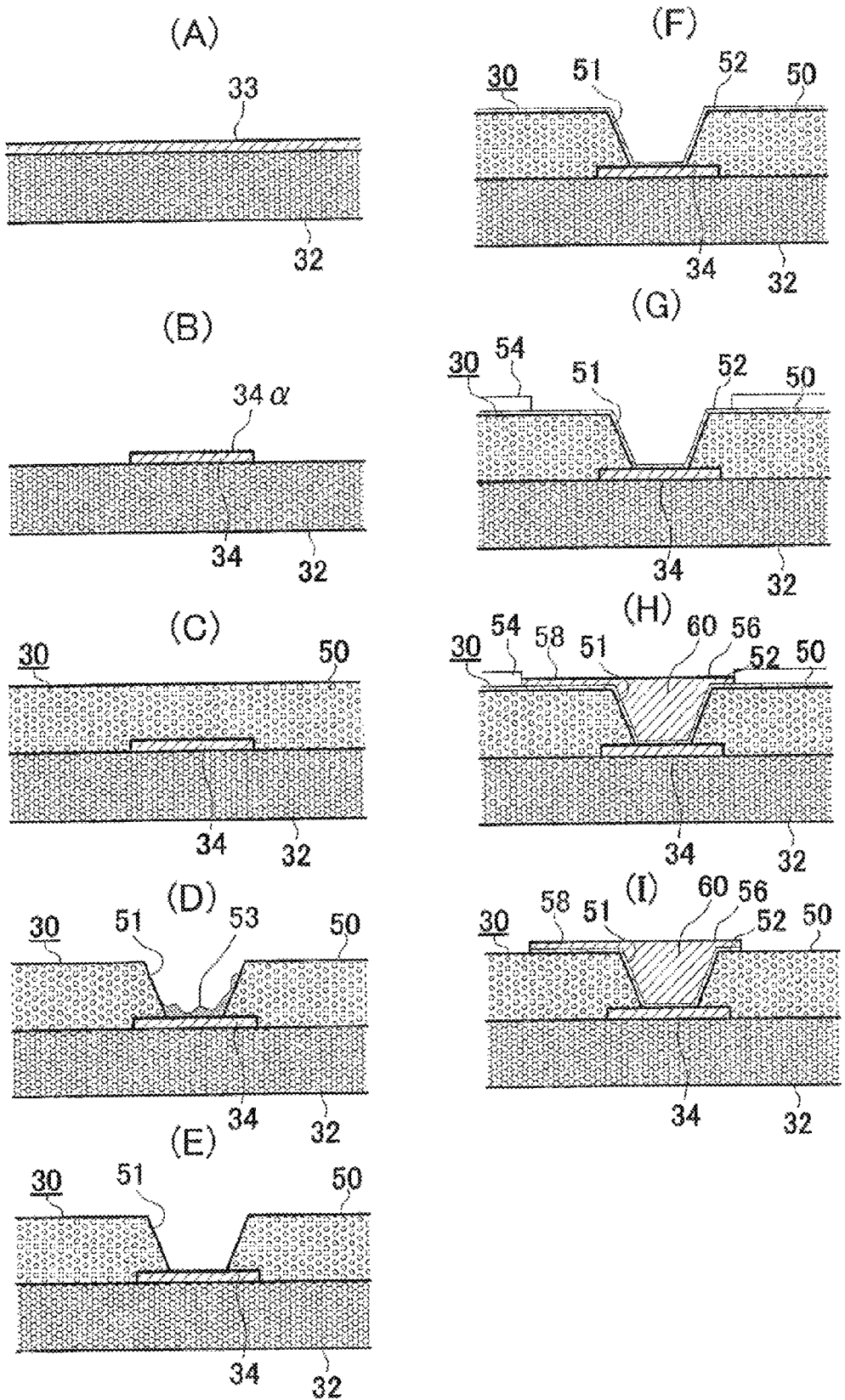
FIGS. 1(A)-1(I) are views showing steps for manufacturing a multilayer printed wiring board according to an embodiment of the present invention.

The embodiments will now be described with reference to the accompanying drawings, wherein like reference numerals designate corresponding or identical elements throughout the various drawings.

Preparation of Copper-Clad Laminate

A copper-clad laminate (product number: MCL-E679F made by Hitachi Chemical Co., Ltd.) is prepared as a starting material (FIG. 1(A)).

Forming Conductive Circuit

Conductive circuit 34 is formed from the copper foil. Roughened surface (34a) is formed on conductive circuit 34 (FIG. 1(B)).

Forming Interlayer Insulation Layer

Resin film 50 is laminated on conductive circuit 34 and substrate 32, and is cured (FIG. 1(C)). The resin film contains inorganic particles such as silica or the like. A later-described interlayer insulation layer contains inorganic particles at 30~80 wt. %. The thermal expansion coefficient of the interlayer insulation layer is lowered. In addition, cracks seldom occur in the interlayer insulation layer. As for the resin film, ABF-GX13 (product number) made by Ajinomoto Fine-Techno Co., Inc. was used here.

Forming Via-Conductor Opening

Using a laser, via-conductor opening 51 is formed in the resin film (FIG. 1(D)). As for the laser, lasers of carbon-dioxide gas, YAG, UV or the like are used. The diameter of a via-conductor opening is 30-100 μm.

In this case, the diameter of a via-conductor opening is set at 50 μm. The diameter of an opening is the diameter on a surface of the interlayer insulation layer. Residue 53 remains on the bottom of a via-conductor opening. When the amount (wt. %) of silica particles contained in the interlayer insulation layer is 30% or greater, it is thought that the amount of resin or silica particles remaining on the bottom of a via-conductor opening increases. However, using a processing gas in the later-described embodiment, the bottom of a via-conductor opening is cleaned because of the high radical density of the plasma. Accordingly, a plasma treatment of the embodiment is preferred to be performed on an interlayer insulation layer that contains silica particles at 30% or greater. When a via-conductor opening with an opening diameter of 50 μm or smaller is formed in an interlayer insulation layer that contains silica particles at 30% or greater, cleaning is hard. However, the bottom of an opening is cleaned by performing a plasma treatment according to the embodiment.

Cutting

Substrate 30 with opening 51 was cut into unit substrate 300 of 5.0 cm².

Desmearing Treatment

Figure 2:
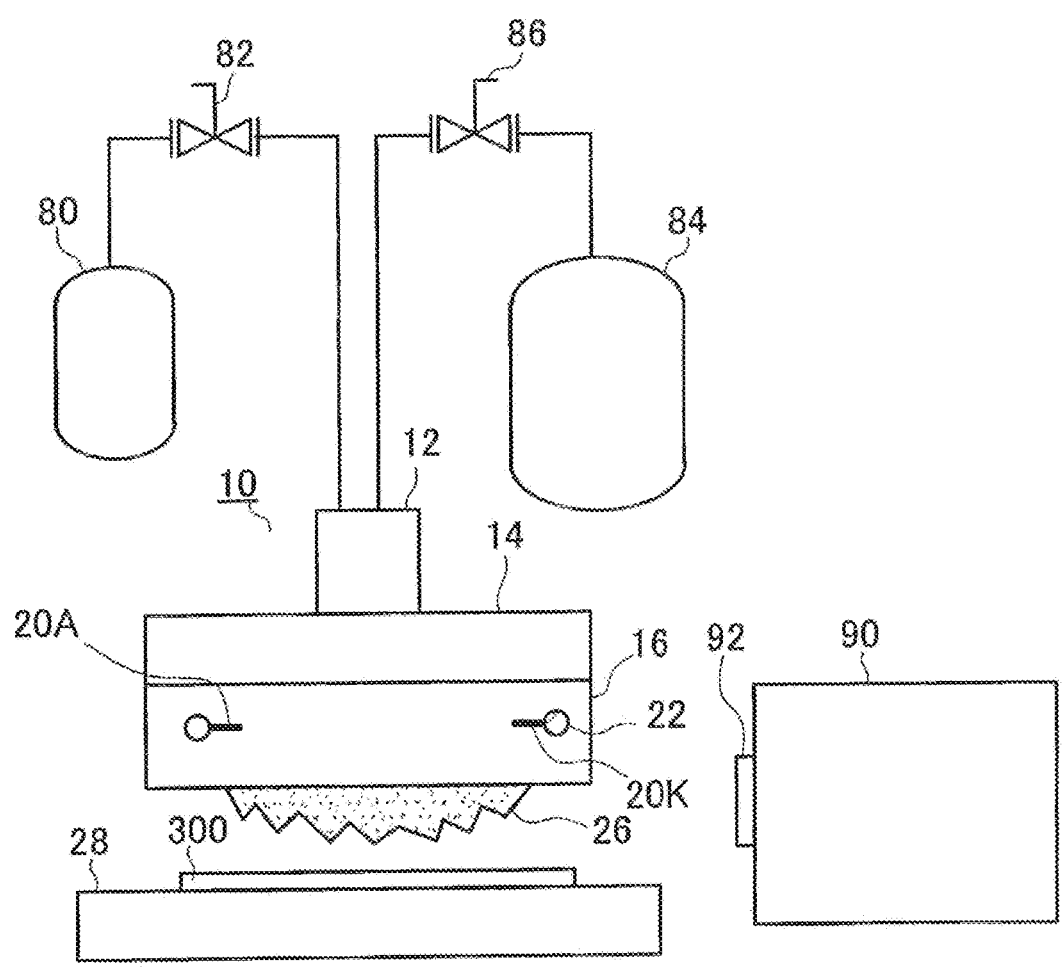
FIG. 2 is a block diagram showing the structure of a plasma irradiation apparatus of the embodiment.

FIG. 2 shows plasma irradiation apparatus 10 of the embodiment. Plasma irradiation apparatus 10 is for 60-Hz non-equilibrium pressure plasma. The pressure is set at 760 Torr. The AC voltage at 60 Hz is raised to approximately 10 kV by a neon transformer, and the raised voltage is applied between two opposing electrodes. Tank 80 containing a reactive gas and tank 84 filled with argon gas are connected to plasma irradiation apparatus 10 through mass flow controllers (82, 86) respectively. Using mass flow controllers (82, 86), the amount of gas flow to adjust the mixing ratio of gases is appropriately changed by 1 sccm. Plasma irradiation apparatus 10 is equipped with gas intake section 12, gas diffusion section 16 and discharge section 16 with electrodes (20A, 20K) supported by coolers 22. A processing gas containing a reactive gas and argon gas flows into discharge section 16, and plasma 26 is produced. Unit 300 is placed on XY table 28, and a desmearing treatment by plasma is performed on the opening for a predetermined duration. The inside of the opening is cleaned (FIG. 1(E)).

Such a plasma treatment is preferred to be performed under atmospheric pressure from the viewpoint of productivity or the like. The residue remaining on a conductive circuit, which is on the bottom of an opening, can be removed by atmospheric-pressure plasma using a gas with a smaller environmental load. Using atmospheric-pressure plasma allows such a treatment to be repeated continuously. For example, the transportation speed of printed wiring boards is set at 1 mm/sec. The thickness of residue is approximately 0.1 μm to 3 μm. According to the embodiment, filler ingredients such as silica remaining on the bottom of an opening are also removed by the plasma treatment at the same time. Therefore, a step for removing the filler (particles) is not required after the plasma treatment. Via conductors with a fine diameter are formed to have high reliability at low cost. Since the desmearing treatment (cleaning via conductor openings) of the embodiment has a small etching impact on the resin in a lateral direction (impact from side etching), the shape of a via-conductor opening is seldom deformed. An opening with a shape such as that shown in FIG. 11(A) is not formed. The shape of a via-conductor opening becomes gradually narrower toward the conductive circuit (FIG. 11(B)). It is easier to form a via conductor. Cracks seldom occur in the via conductor. Also, connection reliability between the via conductor and the conductive circuit is enhanced.

However, it is also an option to perform a plasma treatment under vacuum or reduced pressure. That is because the residue on the bottom of a via-conductor opening is thought to be removed and cleaned through a reaction of the same active species under vacuum or reduced pressure using the processing gas of the embodiment.

When a via-conductor opening is treated by atmospheric-pressure plasma, a bias application is not required. Alternatively, a bias application may be employed. Resin residue remaining on the bottom of a via-conductor opening is removed. The reactive gas is a fluorovinyl ether gas containing a double bond of two carbon atoms and a fluoroalkyl ether group. As for a reactive gas, $C_3F_6O$ (trifluoromethyl trifluorovinyl ether), $C_5F_{10}O$ (perfluoropropyl vinyl ether) and the like are listed (FIG. 8). FIG. 9 shows structural formulas and substance names as examples other than the above. The binding energy of fluoroalkyl ether groups contained in such gases is very small. The value is approximately 1/10 to approximately 1/20 of the binding energy of C and F in $CF_4$. Also, since radicals react at high speed when two carbon atoms are double bonded, reactions of radicals and gas molecules are thought to be facilitated. In addition, when using atmospheric-pressure plasma, since its electron density is especially high, dissociation of gas molecules with little binding energy is thought to occur easily and frequently.

Accordingly, a massive amount of active species (F radicals (F•), $CF_2$ radicals ($CF_2$•), $CF_3$ radicals ($CF_3$•), $CF_3O$ radicals ($CF_3O$•) or the like) for removing residue is thought to be produced in the plasma from a fluorovinyl ether gas (reactive gas) containing a double bond of two carbon atoms and a fluoroalkyl ether group. Also, from the oxygen in atmospheric air and the oxygen mixed in the processing gas, oxygen radicals are produced in the plasma. When such active species react with resin residue in a via-conductor opening, the resin residue is thought to be removed. Then, since the efficiency of generating active species is high in the embodiment, it is thought that resin residue is removed more certainly in the embodiment. The following shows reaction formulas expected when trifluoromethyl trifluorovinyl ether is used as the reactive gas.

Dissociation of a Fluorovinyl Ether Gas

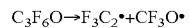

Removal of Resin Ingredient

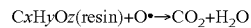

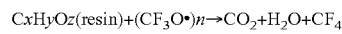

Removal of Silica Particles

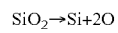

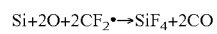

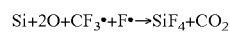

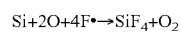

In the reactions above, resin residue and silica particles are thought to become gas and to be removed from the bottom of a via-conductor opening. The conductive circuit is exposed through the via-conductor opening.

In addition, when a plasma treatment is performed, the surface of the interlayer insulation layer other than via-conductor openings is also modified and its wettability is enhanced. Also, since the inside of a via-conductor opening is cleansed, a plating solution easily enters the opening when a via conductor is formed by plating. Especially, the bottom of a via-conductor opening is cleaned. Even if the opening diameter (diameter on the interlayer insulation layer) is 50 μm or smaller, voids are unlikely to occur in the via conductor. Since the resin residue on the bottom of an opening is removed, a via conductor is formed on the conductive circuit. Because there is no resin residue remaining between a via conductor and a conductive circuit, the connection reliability between the via conductor and the conductive circuit is enhanced even if the diameter of the via conductor (diameter on the interlayer insulation layer) is 50 μm or smaller. Since there is no resin residue remaining between a via conductor and a conductive circuit, delamination caused by resin residue seldom occurs between the via conductor and the conductive circuit. Connection reliability is secured in the printed wiring board.

The processing gas may further contain oxygen. The amount (vol. %) is 0.1% to 2%. When the processing gas contains oxygen, resin residue in a via-conductor opening is thought to be removed by oxygen radicals. If the processing gas does not contain oxygen, oxygen radicals are produced in the plasma from the oxygen in atmospheric air. However, if the processing gas contains oxygen, since the density of oxygen radicals increases, the efficiency of removing resin residue is thought to improve.

Since emission intensity is used as an indicator of radical density, plasma irradiation apparatus 10 may include spectroscope (product number: SR-500-B10, made by Andor Technology) 90 as its attachment to measure the emission spectra of plasma. Lens 92 to detect the emission in plasma is attached to the spectroscope. Emission spectra of $CF_2$ radicals and $CF_3$ radicals are known to be observed in a wavelength range of 200 nm~290 nm. Spectroscope 90 is used to adjust the ratio when mixing gases through above-described mass flow controllers (82, 86). For example, the ratio of mixing gases is adjusted so that the emission intensities of $CF_2$ radicals and $CF_3$ radicals are three times or more the emission intensity of a processing gas that contains only argon gas. Namely, when the emission intensity is low, the mixing ratio of a reactive gas in the processing gas is raised, and when the emission intensity is higher than a predetermined threshold level, the mixing ratio of a reactive gas is lowered.

Forming Via Conductor and Conductive Circuit

By performing electroless plating, electroless plated film 52 is formed on interlayer insulation layer 50 and in via-conductor opening 51 (FIG. 1(F)). Plating resist 54 with a predetermined pattern is formed (FIG. 1(G)). By performing electrolytic plating, electrolytic plated film 56 is formed where resist is not formed (FIG. 1(H)). The resist is removed, the electroless plated film between portions of electrolytic film 56 is removed, and conductive circuit 58 and via conductor 60 are completed (FIG. 1(I)).

Test Contents and Test Results

As a reactive gas, $C_3F_6O$ (trifluoromethyl trifluorovinyl ether) or $CF_4$ (tetrafluoromethane) is used. The gas in the example is $C_3F_6O$, and the gas in the comparative example is $CF_4$. The processing gas is a mixed gas of argon, oxygen and a reactive gas. The ratios (vol. %) of mixing a reactive gas in the processing gas are shown in the following.

The mixing ratios of the example are 1.5% and 2%, and the mixing ratios of the comparative example are 1.5%, 2% and 10%. The mixing ratio of oxygen is 0.5 vol. %. Other conditions are shown as follows.

pressure condition: under atmospheric pressure
amount of argon flow: 5.0 slm
distance of a substrate from the plasma irradiation nozzle: 10 mm
treatment time: 1 min.

Figure 5:
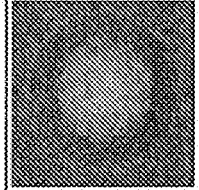
FIG. 5 shows SEM images and binarization results of desmearing treatments.

Under the above conditions, a plasma treatment was performed on each unit substrate. Then, via-conductor openings were photographed by an SEM (product number: S-4800, made by Hitachi High-Technologies Corporation). Those SEM images were binarized, and the degree of residue remaining on the bottoms of the openings after the plasma treatment was evaluated (FIG. 5). The residue contains resin and silica particles. The bottoms of openings are shown in the binarized images. The portions where the residue remains are shown in black, and the portions where the residue was removed are shown in white. The remaining rate is obtained as follows: (the area of resin remaining on the bottom of a via-conductor opening)/(the area of the bottom of the via-conductor opening)×100. The rate of resin remaining on the bottom of a via conductor prior to a desmearing treatment is 100%, and the entire surface of the binarized image is shown in black. When the resin is removed from the bottom of an opening, it is shown in white in the binarized image. When the residue on the entire bottom surface of an opening is sufficiently removed by a treatment using permanganic acid, the remaining rate is 0.2%. When the remaining rate after a plasma treatment is 0.2% or less, it is determined that the residue on the bottom of an opening is sufficiently cleaned (FIG. 6). When the mixing ratio of a reactive gas is the same, the residue on the bottom of an opening is less in the example than in the comparative example. The bottom of an opening is cleaned by a smaller mixing ratio of a reactive gas in the embodiment than in the comparative example.

Figure 3:
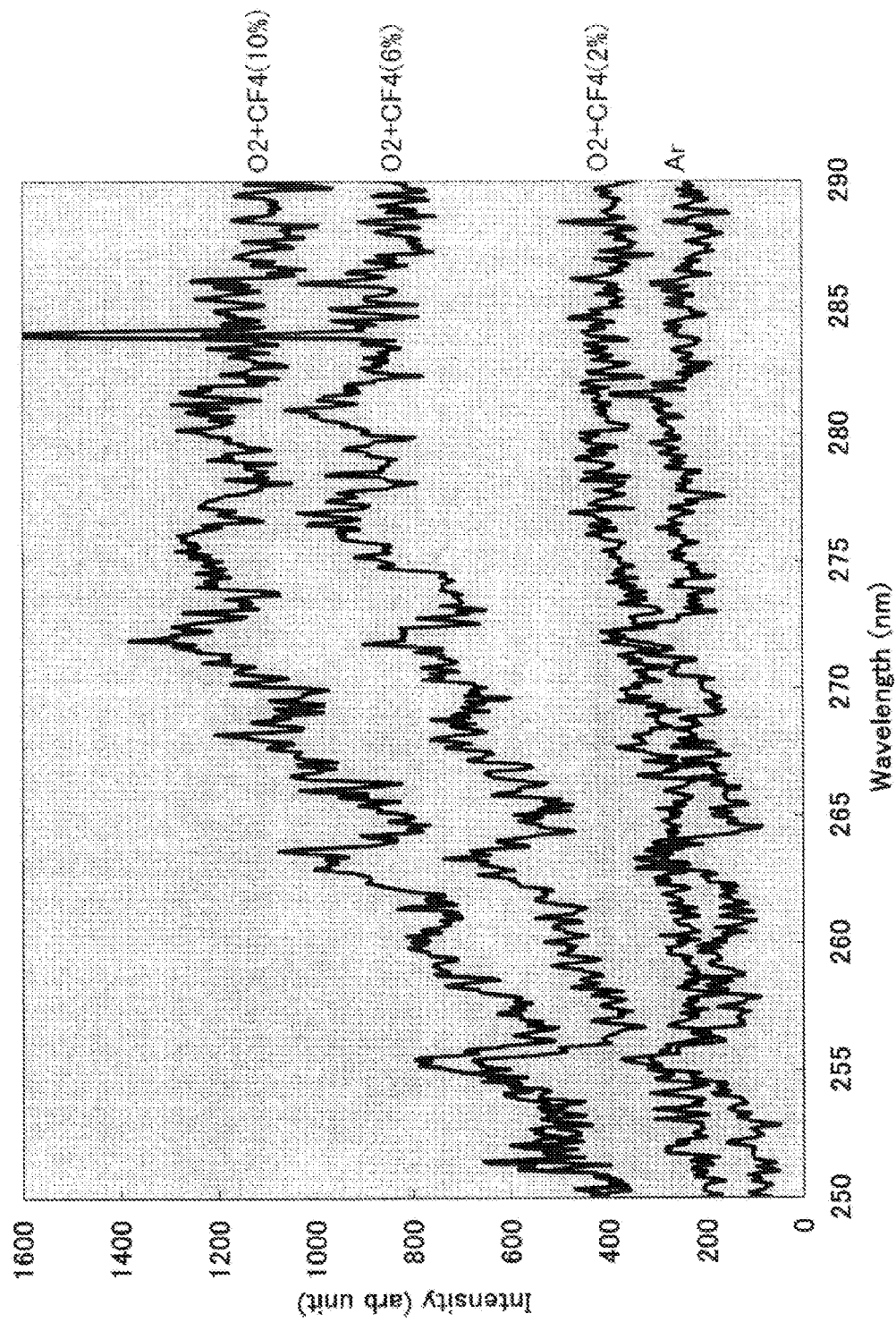
FIG. 3 is a graph showing the results of measuring emission spectra in a wavelength range of 250~290 nm.
Figure 4:
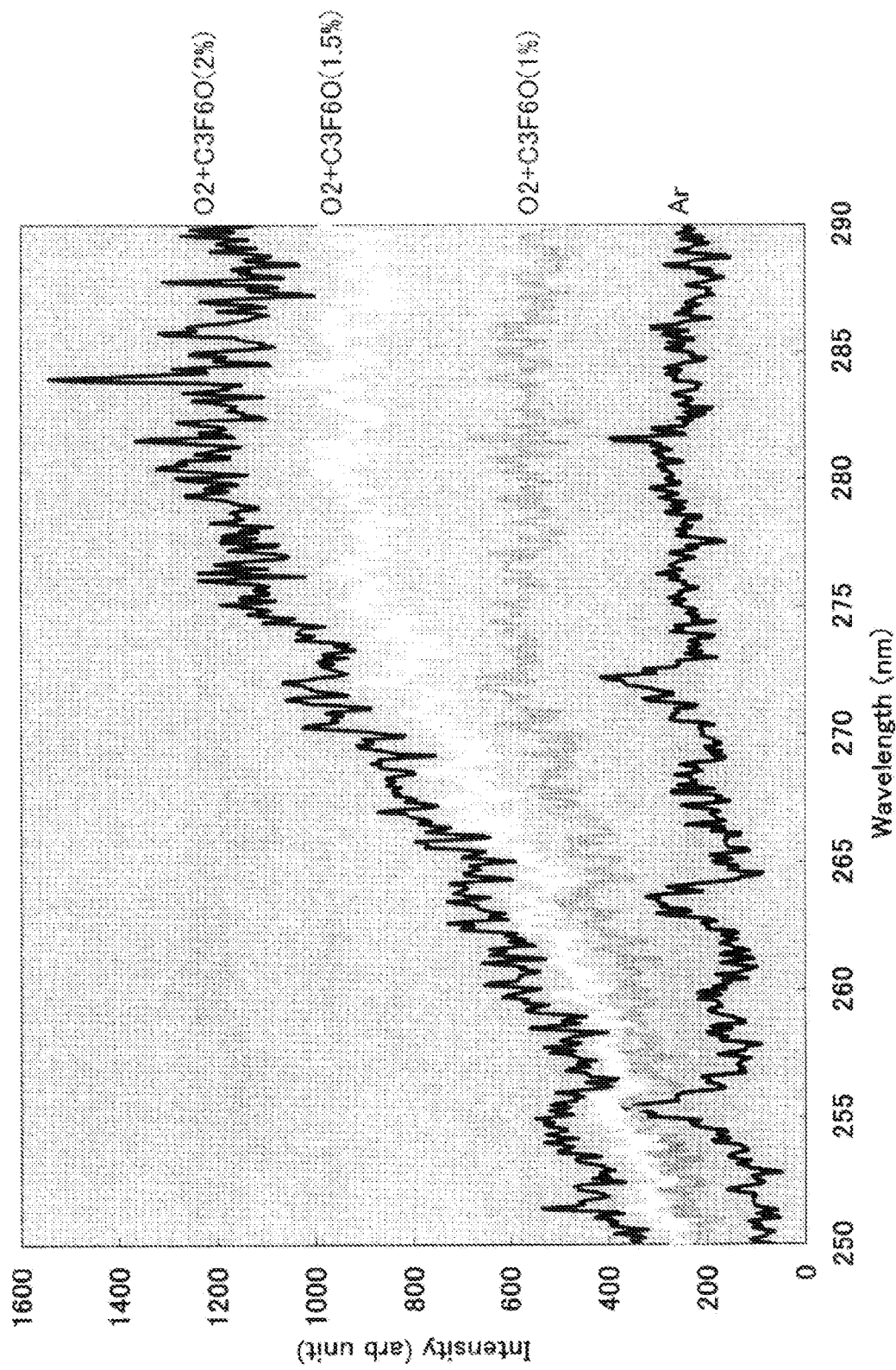
FIG. 4 is a graph showing the results of measuring emission spectra in a wavelength range of 250~290 nm.

Also, emission intensities of radicals in the plasma were measured by emission spectro-photometric analysis using a spectroscope (product number: SR-500-B10, made by Andor Technology). The results of emission intensities in a wavelength range of 250-290 nm are shown in FIGS. 3 and 4. The emission spectra of $CF_2$ radicals ($CF_2 \cdot$) and $CF_3$ radicals ($CF_3 \cdot$) exist in a wavelength range of 250 nm to 290 nm. Emission intensities when a processing gas contains $CF_4$ are shown in FIG. 3. Emission intensities when a processing gas contains $C_3F_6O$ are shown in FIG. 4. When the results in FIG. 3 and the results in FIG. 4 are compared, even if the mixing ratio of $C_3F_6O$ is smaller than the mixing ratio of $CF_4$, equivalent emission intensities are obtained. For example, the emission intensity when the density of $CF_4$ in a processing gas is 10 vol. % is almost the same as the emission intensity when the density of $C_3F_6O$ in a processing gas is 2 vol. %. From the above results, it is thought that a fluorovinyl ether gas containing a double bond of two carbon atoms and a fluoroalkyl ether group tends to produce active species such as $CF_2$ radicals and $CF_3$ radicals, in contrast to a $CF_4$ gas. Accordingly, even when the density of a fluorovinyl ether gas is relatively low, resin residue is thought to be removed. The reactive gas of the embodiment is thought to be more efficient in removing residue than $CF_4$. Thus, the amount of a fluorovinyl ether gas to be used is lowered, making the process inexpensive. Also, the embodiment has the advantage that the impact on human bodies and the environment is reduced.

As one of the reasons for the difference between FIG. 3 and FIG. 4, since the above-described fluorovinyl ether gas tends to dissociate frequently, the amount of fluorine radicals (such as $CF_2$ radicals, $CF_3$ radicals and F radicals) produced per one molecule is thought to be great. In the embodiment, the radical density in the plasma is thought to be high. Accordingly, the amount of a fluorovinyl ether gas is thought to be reduced in the processing gas. In addition to a fluorovinyl ether gas, the processing gas is preferred to contain at least one of $O_2$, Ar, He and $N_2$. Also, a fluorovinyl ether gas in the embodiment has a low global-warming potential (for example, GWP 100 or smaller). Using a processing gas made by such gases and a discharge gas (such as argon), via-conductor openings are cleaned by atmospheric-pressure plasma. The inside of a via-conductor opening and its bottom are treated by plasma. The amount (vol. %) of a reactive gas in the processing gas is 0.5% to 5%.

When the reactive gas of the embodiment is compared with the reactive gas of the comparative example, the radical density of plasma is thought to be higher in the embodiment. Thus, chemical reactions of residue and radicals are thought to occur more frequently in the embodiment than in the comparative example.

Accordingly, residue is thought to be removed even with a lower density of a reactive gas in the embodiment. Performing an atmospheric-pressure plasma treatment (such as 60-Hz non-equilibrium pressure plasma) is a preferred example of the embodiment. Equipment cost decreases. Desmearing treatments are performed at low cost under a lower environmental load.

If the density of a reactive gas is low, the impact on human bodies and the environment is suppressed. Also, the processing cost is lowered. Accordingly, the embodiment is suitable for a process of manufacturing highly functional high-density printed wiring boards safely at low cost.

In addition, the global-warming potential (HGWP) of $C_3F_6O$ is 0.01 or lower, while the global-warming potential (HGWP) of $CF_4$ is 7.1. Moreover, since $C_3F_6O$ is used at a density ⅓ or lower that of $CF_4$, $C_3F_6O$ is environmentally friendly.

When plasma and radicals collide at the bottom of a via-conductor opening, it may be helpful for removing residue. In such a case, the bottom of a via-conductor opening is certainly cleansed. In the embodiment, since the reactive gas contains oxygen under atmospheric pressure, a massive amount of oxygen radicals is obtained. It is considered preferable for removing resin residue. According to the embodiment, since resin or filler residue on the bottom of a via-conductor opening is reduced, the formation of a via conductor is not hindered. Therefore, connection reliability is enhanced. Accordingly, the plasma treatment according to the embodiment is a useful technology for obtaining highly functional high-density printed wiring boards.

Figure 10:
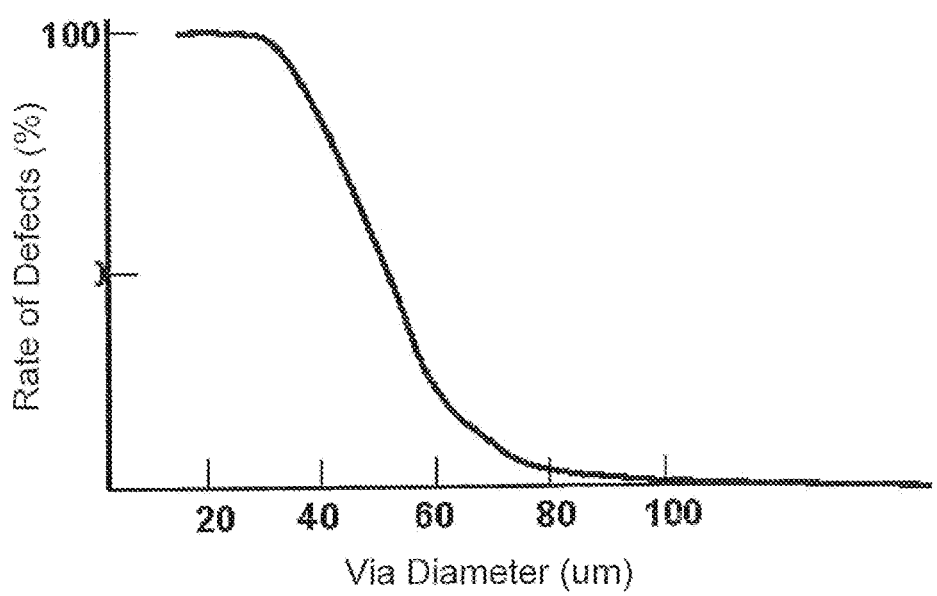
FIG. 10 is a graph showing the relationship between the diameter of a via-conductor opening and the rate of defects in a substrate.

As the imaging view in FIG. 10 shows, when the diameter of a via conductor becomes smaller, the rate of defects in a substrate is thought to increase. Resin residue in a via-conductor opening is thought to be one of the reasons. When the diameter of an opening for a via conductor becomes smaller, it is harder to remove resin residue from the bottom of the opening by a wet desmearing treatment using a permanganic acid solution, because the treatment solution fails to go into the via-conductor opening or because air bubbles are formed in the opening. Such situations are thought to cause conduction failure.

In addition, to reduce the CTE of an interlayer insulation layer, the amount of inorganic filler in the interlayer insulation layer is increased. Therefore, the formation of an opening by a laser is thought to be hindered, causing an increase in the amount of resin residue including inorganic particles such as silica particles left on the bottom of the via-conductor opening. Conduction failure is thought to occur.

Since $CF_4$ has a high global-warming potential (GWP), performing a plasma treatment using a gas containing $CF_4$ is considered to have a negative impact on the environment. Increasing the density of $CF_4$ in a gas for producing plasma is thought to have a negative impact on human bodies and the environment. For example, exposure to gas is thought to cause problems such as health hazards and global warming.

A method for manufacturing a printed wiring board according to an embodiment of the present invention includes the following: forming an interlayer insulation layer on a conductive circuit; in the interlayer insulation layer, forming an opening for a via conductor on the conductive circuit by using a laser; performing a plasma treatment on the opening by using a processing gas that contains a fluorovinyl ether gas having a double bond of two carbon atoms and a fluoroalkyl ether group; forming an upper conductive circuit on the interlayer insulation layer; and forming a via conductor in the opening.

The above embodiment describes how to remove residue from inside an opening formed by a laser. However, the embodiment of the present invention may also be used for cleaning an opening formed through exposure and development treatments.

Obviously, numerous modifications and variations of the present invention are possible in light of the above teachings. It is therefore to be understood that within the scope of the appended claims, the invention may be practiced otherwise than as specifically described herein.

What is claimed is:

1. A method for manufacturing a printed wiring board, comprising:
    forming an interlayer insulation layer on a conductive circuit;
    applying laser to a portion of the interlayer insulation layer such that an opening reaching to the conductive circuit is formed for a via conductor;
    subjecting the opening to a plasma treatment using a processing gas which includes a reactive gas comprising a fluorovinyl ether gas having a double bond of two carbon atoms and a fluoroalkyl ether group;
    forming an upper conductive circuit on the interlayer insulation layer; and
    forming a via conductor in the opening such that the via conductor connects the conductive circuit and the upper conductive circuit,
    wherein the plasma treatment is a 60-Hz non-equilibrium plasma treatment under an atmospheric pressure, and the reactive gas is at least one of trifluorovinyl(pentafluoroallyl) ether and decafluoro-3-oxa-1,6-heptadiene.

2. The method for manufacturing a printed wiring board according to claim 1, wherein the subjecting of the opening to the plasma treatment includes cleaning a surface portion of the conductive circuit at a bottom of the opening.

3. The method for manufacturing a printed wiring board according to claim 1, wherein the processing gas further includes at least one of $O_2$, Ar, He and $N_2$.

4. The method for manufacturing a printed wiring board according to claim 1, wherein the interlayer insulation layer includes a silica filler in an amount of 30% or greater in the interlayer insulation layer.

5. The method for manufacturing a printed wiring board according to claim 1, wherein the via conductor is formed such that the via conductor has a diameter which is set at 50 μm or smaller.

6. The method for manufacturing a printed wiring board according to claim 1, further comprising detecting an emission intensity of one of $CF_2$ radical and $CF_3$ radical in a wavelength range of 200 nm to 290 nm during the subjecting of the opening to the plasma treatment.

7. The method for manufacturing a printed wiring board according to claim 1, further comprising detecting an emission intensity of one of $CF_2$ radical and $CF_3$ radical in a wavelength range of 200 nm to 290 nm through an emission spectro-photometric analysis during the subjecting of the opening to the plasma treatment.

8. The method for manufacturing a printed wiring board according to claim 6, wherein the emission intensity is at least three times an emission intensity of a gas containing only argon gas.

9. The method for manufacturing a printed wiring board according to claim 1, further comprising detecting emission intensities of $CF_2$ radical and $CF_3$ radical in a wavelength range of 200 nm to 290 nm during the subjecting of the opening to the plasma treatment.

10. The method for manufacturing a printed wiring board according to claim 1, further comprising detecting emission intensities of $CF_2$ radical and $CF_3$ radical in a wavelength range of 200 nm to 290 nm through an emission spectro-photometric analysis during the subjecting of the opening to the plasma treatment.

11. The method for manufacturing a printed wiring board according to claim 1, wherein the processing gas includes $O_2$ in an amount of from 0.1% to 2% in the processing gas.

12. The method for manufacturing a printed wiring board according to claim 1, wherein the interlayer insulation layer includes inorganic particles.

13. The method for manufacturing a printed wiring board according to claim 1, wherein the interlayer insulation layer includes inorganic particles in an amount of from 30 wt. % to 80 wt. %.

14. The method for manufacturing a printed wiring board according to claim 11, wherein the reactive gas in the processing gas is in an amount of from 0.5 vol. % to 5 vol. %.

15. The method for manufacturing a printed wiring board according to claim 1, wherein the reactive gas in the processing gas is in an amount of from 0.5 vol. % to 5 vol. %.

16. The method for manufacturing a printed wiring board according to claim 1, further comprising adjusting a mixing ratio of the processing gas, wherein the processing gas includes $O_2$ in an amount of from 0.1% to 2% in the processing gas.

17. The method for manufacturing a printed wiring board according to claim 1, further comprising:
   detecting an emission intensity of one of $CF_2$ radical and $CF_3$ radical in a wavelength range of 200 nm to 290 nm during the subjecting of the opening to the plasma treatment; and
   adjusting a mixing ratio of the processing gas such that the emission intensity is at least three times an emission intensity of a gas containing only argon gas,
wherein the processing gas includes $O_2$ in an amount of from 0.1% to 2% in the processing gas.

18. The method for manufacturing a printed wiring board according to claim 1, wherein the forming of the upper conductive circuit and the forming of the via conductor comprise forming an electrolytic plated film forming the upper conductive circuit and filling the opening with an electrolytic plating material forming the via conductor.

19. The method for manufacturing a printed wiring board according to claim 14, wherein the subjecting of the opening to the plasma treatment includes cleaning a surface portion of the conductive circuit at a bottom of the opening.

20. The method for manufacturing a printed wiring board according to claim 15, wherein the subjecting of the opening to the plasma treatment includes cleaning a surface portion of the conductive circuit at a bottom of the opening.

* * * * *